United States Patent
Jeon

(10) Patent No.: US 9,299,756 B2
(45) Date of Patent: Mar. 29, 2016

(54) ORGANIC LIGHT EMITTING DISPLAY DEVICE

(71) Applicant: SAMSUNG DISPLAY CO., LTD., Yongin, Gyeonggi-Do (KR)

(72) Inventor: Mu-Kyung Jeon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/598,790

(22) Filed: Jan. 16, 2015

(65) Prior Publication Data

US 2015/0243721 A1    Aug. 27, 2015

(30) Foreign Application Priority Data

Feb. 25, 2014   (KR) ...................... 10-2014-0021787

(51) Int. Cl.
*H01L 27/32* (2006.01)

(52) U.S. Cl.
CPC ........ *H01L 27/3262* (2013.01); *H01L 27/3248* (2013.01); *H01L 27/3265* (2013.01); *H01L 27/3276* (2013.01)

(58) Field of Classification Search
CPC ............ H01L 27/3262; H01L 27/3265; H01L 27/3276; H01L 27/3248
See application file for complete search history.

(56) References Cited

U.S. PATENT DOCUMENTS

2010/0309233 A1   12/2010   Choi
2012/0001893 A1    1/2012   Jeong et al.

FOREIGN PATENT DOCUMENTS

| KR | 10-2004-0060473 A | 7/2004 |
|----|-------------------|--------|
| KR | 10-2010-0093450   | 8/2010 |
| KR | 10-2012-0002070   | 1/2012 |
| KR | 10-2013-0031099 A | 3/2013 |

*Primary Examiner* — David Vu
(74) *Attorney, Agent, or Firm* — Lee & Morse, P.C.

(57) ABSTRACT

A pixel includes a driving transistor to control an amount of drain-to-source current flowing from a first electrode to a second electrode based on a voltage applied to a first gate electrode. The current is used to control light emitted from an organic light emitting diode. The pixel also includes a first transistor coupled between the first gate electrode and second electrode of the driving transistor. The first gate electrode is under an active layer of the driving transistor, and the first gate electrode overlaps the active layer of the driving transistor.

20 Claims, 14 Drawing Sheets

ORGANIC LIGHT EMITTING DISPLAY DEVICE

CROSS-REFERENCE TO RELATED APPLICATION

Korean Patent Application No. 10-2014-0021787, filed on Feb. 25, 2014, and entitled, "Organic Light Emitting Display Device," is incorporated by reference herein in its entirety

BACKGROUND

1. Field

One or more embodiments described herein relate to a display device.

2. Description of the Related Art

Various types of flat panel displays have been developed. Examples include liquid crystal displays, plasma display panels, and organic light emitting displays. Organic light emitting displays are driven at a low voltage, are relatively thin, and have a wide viewing angle and quick response speed.

The pixels of an organic light emitting display may be arranged in a matrix. Each pixel includes a driving transistor which adjusts the amount of current to an organic light emitting diode based on a gate voltage.

In operation, the threshold voltage Vth of the driving transistor may fluctuate by process errors, or may shift or change as a result of pixel degradation over time. As a result, the threshold voltage Vth of the driving transistor may vary from pixel to pixel. This causes the luminance of the pixels to differ for the same data voltage, which adversely affects display quality.

SUMMARY

In accordance with one embodiment, an organic light emitting display device includes a display panel including data lines, scan lines, and a plurality of pixels, wherein each of the pixels includes: a driving transistor configured to control an amount of drain-to-source current flowing from a first electrode to a second electrode according to a voltage applied to a first gate electrode; an organic light emitting diode (OLED) configured to emit light depending on the drain-to-source current of the driving transistor; and a first transistor coupled between the first gate electrode and second electrode of the driving transistor, wherein the first gate electrode is under an active layer of the driving transistor and wherein the first gate electrode overlaps the active layer of the driving transistor.

Part of the first gate electrode may overlap part of an anode of the OLED. The first gate electrode may be coupled to an active layer of the first transistor through a first contact hole. The display device may include an insulator covering the first gate electrode, wherein the first contact hole penetrates the insulator to expose the first gate electrode.

The driving transistor may include a second gate electrode over the active layer of the driving transistor, the second gate electrode overlaps the active layer of the driving transistor. The first gate electrode may be coupled to the second gate electrode through a second contact hole. The second contact hole may penetrate a plurality of insulators. The active layer of the driving transistor and the active layer of the first transistor may include polysilicon.

The display panel may include emission lines, and each of the pixels may include: a second transistor coupled between a data line and the first electrode of the driving transistor; a third transistor coupled between the first gate electrode and a first power voltage line to which a first power voltage is supplied; a fourth transistor coupled to an anode of the OLED and the first power voltage line; a fifth transistor coupled to the first electrode of the driving transistor and a second power voltage line to which a second power voltage is supplied; and a sixth transistor coupled to the second electrode of the driving transistor and the anode of the OLED.

Each of the pixels may include a capacitor between the first gate electrode and the second power voltage line. A gate electrode of the first transistor and a gate electrode of the second transistor may be coupled to a scan line, a gate electrode of the third transistor and a gate electrode of the fourth transistor may be coupled to another scan line, gate electrode of the fifth transistor and a gate electrode of the sixth transistor may be coupled to an emission line.

A scan signal from the another scan line may have a gate-on voltage during first and second periods, a scan signal from the scan line may have a gate-on voltage during third period, an emission signal from the emission line may have a gate-on voltage during first and fourth periods. A cathode of the OLED may be coupled to a third power voltage line to which a second power voltage is supplied.

In accordance with another embodiment, a pixel includes an organic light emitting diode (OLED); a driving transistor to control an amount of current to the OLED; and a first transistor coupled between two terminals of the driving transistor, wherein the driving transistor has a double-gate structure including a first gate and a second gate, the first gate coupled to an active layer of the first transistor and the second gate overlapping the first gate, and wherein an active layer of the driving transistor is between the first and second gates.

The first gate may have a first length, and the second gate may have a second length less than the first length. The first gate may be spaced from a terminal of the OLED by a first distance, and the second gate may be spaced from the terminal of the OLED by a second distance less than the first distance.

The pixel may include a first insulator between the first gate and active layer of the driving transistor, and a second insulator between the second gate and active layer of the driving transistor. The second gate may not overlap the active layer of the first transistor. The second gate may be coupled to a capacitor to store a data voltage. The first gate may extend beyond a terminal of the OLED to establish a coupling to the active layer of the first transistor.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
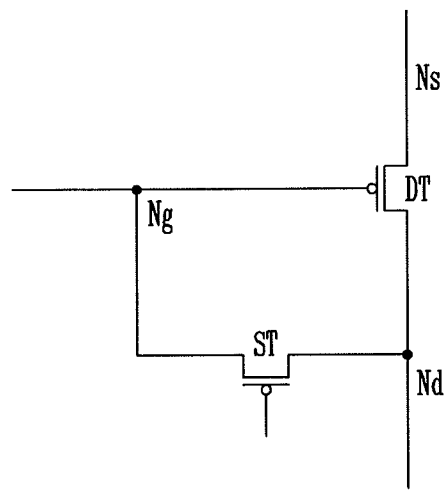
FIG. 1 illustrates a portion of a pixel subject to threshold voltage compensation of a driving transistor in a diode-connected state.

FIG. 1 illustrates a pixel in a diode-connected state for compensating variations in the threshold voltage of a driving transistor DT. The driving transistor DT supplies current to an organic light emitting diode (OLED). A switch transistor ST is coupled between a gate node Ng and a drain node Nd. The gate node Ng is coupled to a gate electrode of the driving transistor DT, and the drain node Nd is coupled to a drain electrode of the driving transistor DT.

The switch transistor ST couples the gate node Ng and the drain node Nd during a data voltage supply period for supplying a data voltage to the source node Ns. In this state, the driving transistor DT is diode-coupled. The source node Ns is coupled to a source electrode of the driving transistor DT. Therefore, the voltage of the gate node Ng and the voltage of the drain node Nd have substantially the same potential.

If a voltage difference Vgs between the gate node Ng and the source node Ns is greater than a threshold voltage of the driving transistor DT, the driving transistor DT forms a current path until the voltage difference Vgs between the gate node Ng and the source node Ns reaches the threshold voltage Vth of the driving transistor DT. As a result, the voltage of the gate node Ng and the voltage of the drain node Nd rise.

Therefore, if the data voltage Vdata is supplied to the source node Ns, the voltage of the gate node Ng and the voltage of the drain node Nd reach a voltage difference Vdata−Vth between the data voltage Vdata and the threshold voltage Vth of the driving transistor DT. A capacitor may store the voltage difference Vdata−Vth between the data voltage Vdata and the threshold voltage Vth of the driving transistor DT, if the capacitor is coupled between the gate node Ng and a power voltage line.

As a result, the diode-coupled, threshold voltage compensation pixel may delete or cancel out the threshold voltage term Vth in Equation 1:

$$I_{ds} = k' \cdot (V_{gd} - V_{th})^2, \quad (1)$$

where Ids is the drain-to-source current of the driving transistor supplied to the organic light emitting diode, k' represents a proportionality coefficient determined by the structure and physical properties of the driving transistor, Vgs represents the gate-source voltage of the driving transistor, and Vth represents the threshold voltage of the driving transistor.

From Equation 1, it is apparent that the drain-to-source current Ids of the driving transistor depends on the threshold voltage Vth of the driving transistor. By placing the driving transistor in a diode-coupled state as previously discussed, the threshold voltage (Vth) term in Equation 1 may be cancelled out, to thereby compensate for variations in the threshold voltage Vth of the driving transistor DT.

Figure 2:
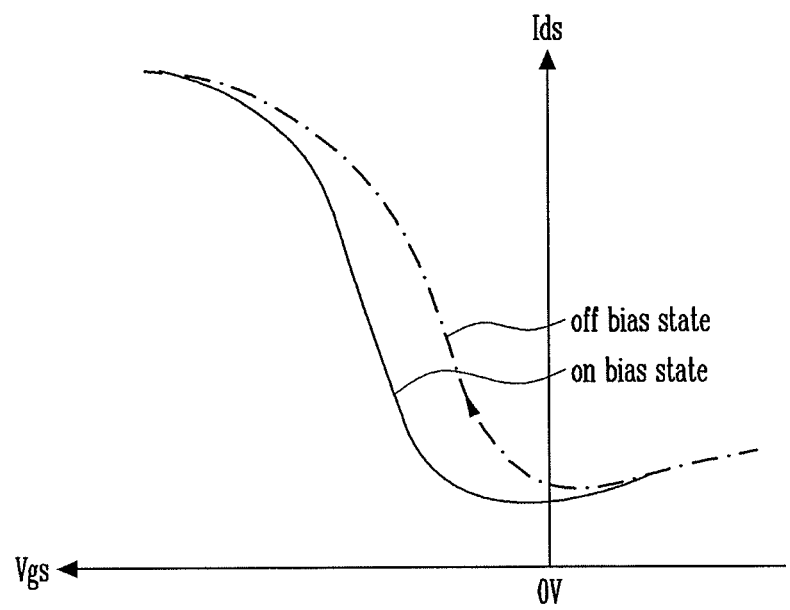
FIG. 2 illustrates an example of drain-to-source current of the driving transistor in on-bias and off-bias states.

FIG. 2 illustrates an example of the drain-to-source current of the driving transistor in on-bias and off-bias states. Referring to FIGS. 1 and 2, the drain-to-source current Ids of the driving transistor DT, according to the voltage difference Vgs between the gate node Ng and a source node Ns, may be different in the on-bias state and the off-bias state. This result may be attributable to the hysteresis characteristics of the driving transistor DT.

The on-bias state is indicative of a state in which driving transistor DT is turned on by supplying a on-bias voltage to the gate electrode of the driving transistor DT. As a result, the drain-to-source current Ids flows through the channel of the driving transistor DT. The on-bias voltage may be, for example, a white grayscale voltage.

The off-bias state is indicative of a state in which the driving transistor DT is turned off (e.g., the drain-to-source current Ids hardly flows through the channel of the driving transistor DT). This may be accomplished by supplying a off-bias voltage to the gate electrode of the driving transistor DT. The off-bias voltage may be a black grayscale voltage. A white grayscale voltage may be a voltage for causing an OLED to emit light having a white (or lighter) grayscale value. A black grayscale voltage may be a voltage for causing the OLED to emit light having a black (or darker) grayscale value.

Figure 3:
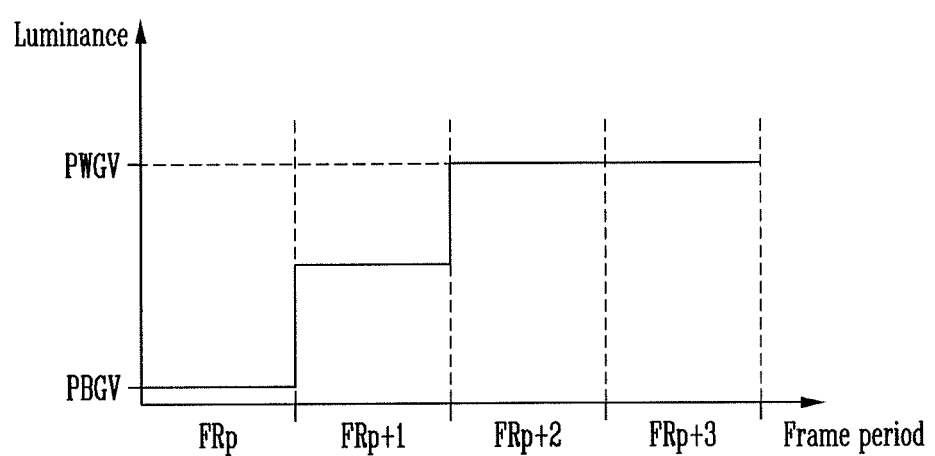
FIG. 3 illustrates an example of the luminance of a pixel when a peak black grayscale voltage is supplied during a p-th frame period and peak white grayscale voltages are supplied during (p+1)-th to (p+3)th frame periods.

FIG. 3 illustrates luminance of a pixel when a peak black grayscale voltage is supplied during a p-th frame period and peak white grayscale voltages are supplied during (p+1)-th to (p+3)th frame periods in a related-art implementation. Referring to FIG. 3, in the first frame period FR1, a pixel emits light having a black grayscale value. In each of the second to fourth frame periods FR2 to FR4, the pixel emits light having one or more white grayscale values.

From FIG. 3, it is evident that the drain-to-source current Ids of the driving transistor DT increases in steps as a result of hysteresis characteristics of the driving transistor DT when a pixel emits light having white grayscale value after black gray scale value. This may occur, for example, when the driving transistor DT is formed by a low temperature Poly-Si (LTPS) process.

Referring to FIGS. 1 to 3, the peak black grayscale voltage PBGV is supplied to the gate electrode of the driving transistor DT during the p-th frame period FRp. Thus, the peak white grayscale voltage PWGV is supplied to the driving transistor DT at the off-bias state during the (p+1)-th frame period FRp+1.

Also, because the peak white grayscale voltage PWGV is supplied to the gate electrode of the driving transistor DT during the (p+1)-th frame period FRp+1, the peak white grayscale voltage PWGV is supplied to the driving transistor DT in the on-bias state during the (p+2)-th frame period. That is, the driving transistor DT is not at the same bias state during the (p+1)-th and (p+2)-th frame periods FRp+1 and FRp+2, even though the same peak white grayscale voltage PWGV is supplied to the gate electrode of the driving transistor DT.

As a result, the drain-to-source current Ids of the driving transistor DT during the (p+1)-th frame period FRp+1 is lower than during the (p+2)-th frame period FRp+2, even though the same peak white grayscale voltage PWGV is supplied to the gate electrode of the driving transistor DT.

Therefore, as shown in FIG. 3, the luminance of light emitted from an OLED during the (p+1)-th frame period FRp+1 is lower than during the (p+2)-th frame period FRp+2. Accordingly, picture quality may be lowered due to a luminance difference between the (p+1)-th frame period FRp+1 and the (p+2)-th frame period FRp+2.

One or more embodiments described herein improve picture quality by minimizing a luminance difference between white grayscale display periods caused by the hysteresis characteristics of the driving transistor DT.

Figure 4:
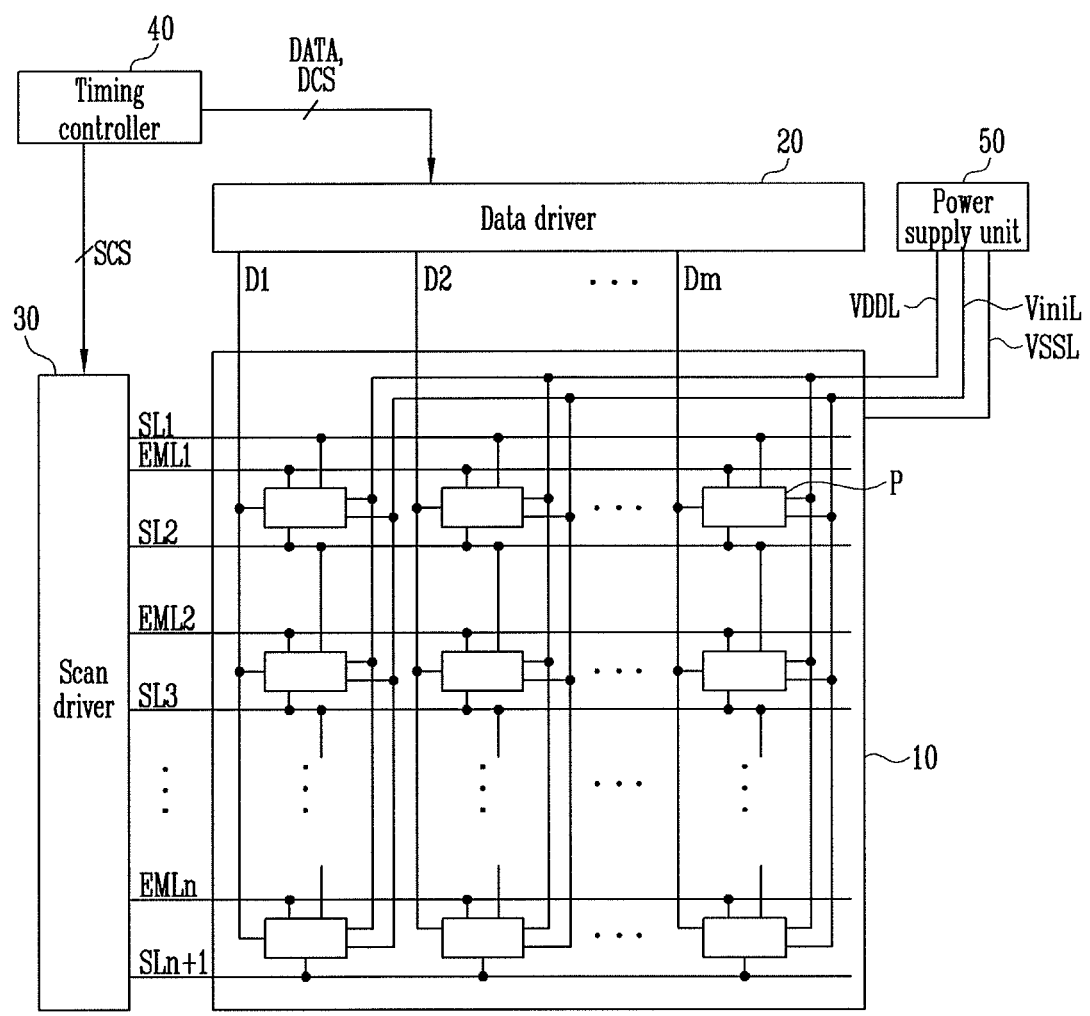
FIG. 4 illustrates an embodiment of an organic light emitting display device.

FIG. 4 illustrates an embodiment of organic light emitting display device which includes a display panel 10, a data driver 20, a scan driver 30, a timing controller 40, and a power supply unit 50.

The display panel 10 includes pixels P arranged in a matrix, and data lines D1 to Dm and scan lines SL1 to SLn that cross each other, where m≥2 and n≥2. Emission lines EML1 to EMLn may be formed parallel to scan lines SL1 to SLn.

The data driver 20 includes at least one source drive integrated circuit (IC). The source drive IC receives digital video data DATA from timing controller 40. The source drive IC converts the digital video data DATA into gamma compensation voltages in response to a source timing control signal DCS from timing controller 40, to generate data voltages. The source drive ICs supply the data voltages to respective data lines D1 to Dm in synchronization with scan signals SCAN. Therefore, the data voltages are supplied to pixels to which a scan signal SCAN is supplied.

The scan driver 30 outputs scan signals and emission signals. The scan driver 30 may include a scan signal output section and an emission signal output section. Each of these sections may have a shift register for sequentially outputting the aforementioned signals, a level shifter for shifting the signals of the shift register to a swing width suitable for transistors of the pixels, and/or a buffer. The scan signal output section may sequentially output scan signals SCAN to the scan lines SL1 to SLn. The emission signal output section may sequentially output emission signals EM to the emission lines EML1 to EMLn.

The timing controller 40 receives the digital video data DATA from a host system through an interface, which, for example, may be a low voltage differential signaling (LVDS) interface, a transition minimized differential signaling (TMDS) interface, or another type of interface. The timing controller 40 receives timing signals such as a vertical synchronization signal, a horizontal synchronization signal, a data enable signal, and/or a dot clock, and generates timing control signals for controlling operational timing of the data driver 20 and the scan driver 30 based on the timing signals.

The timing control signals include a scan timing control signal for controlling the operation timing of the scan driver 30 and a data timing control signal for controlling the operation timing of the data driver 20. The timing controller 40 outputs the scan timing control signal to the scan driver 30, and outputs the data timing control signal and digital video data DATA to the data driver 20.

The power supply unit 50 supplies a first power voltage to the pixels P through first voltage supply lines ViniL, a second power voltage to the pixels P through the second voltage supply line VDDL, and a third power voltage to the pixels P through the third voltage supply line VSSL. The first power voltage may be an initialization voltage, the second power voltage may be a high-potential voltage, and the third power voltage may be a low-potential voltage.

Also, power supply unit 50 supplies a gate-on voltage Von and a gate-off voltage Voff to the scan driver 30. The gate-on voltage Von turns on transistors of the pixels P, and the gate-off voltage Voff turns off these.

Figure 5:
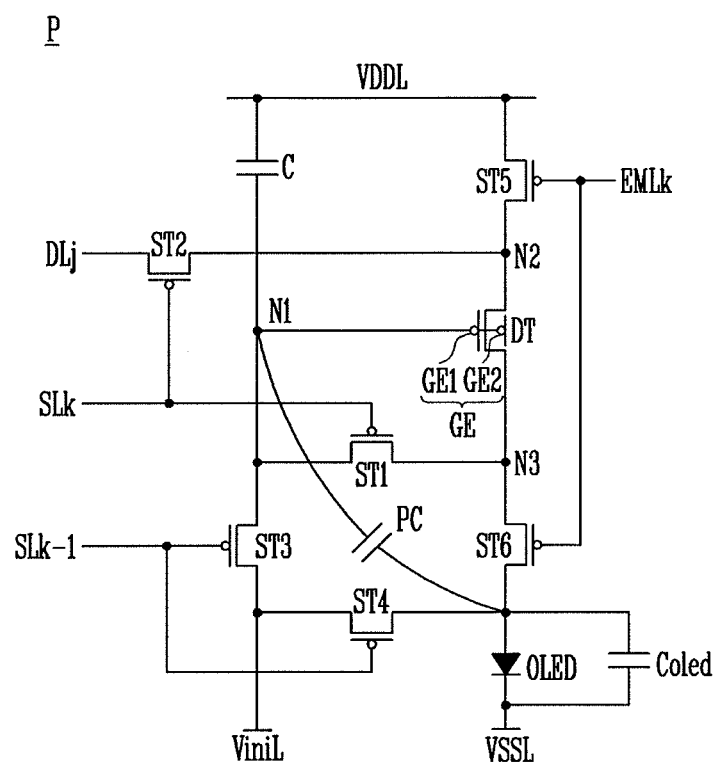
FIG. 5 illustrates an embodiment of a pixel.

FIG. 5 illustrates an embodiment of a pixel P coupled to a scan line, another scan line, a data line, and an emission line. For example, pixel P may be coupled to a (k−1)-th scan line SLk−1, a k-th scan line SLk, a k-th emission line EMLk, and a j-th data line Dj, where n+1≥k≥2 and m≥j≥1. In this embodiment, the pixel P is coupled to the first to third power voltage lines ViniL, VDDL, and VSSL.

The pixel P includes a driving transistor DT, an OLED, switch elements, and a storage capacitor C. The switch elements include first to fifth transistors ST1 to ST6.

The driving transistor DT controls an amount of drain-to-source current Ids flowing from a first electrode to a second electrode of the driving transistor DT. The amount of current Ids is based on a voltage applied to gate electrode GE of the driving transistor DT. The drain-to-source current Ids may be proportional to the square of a difference between the gate-source voltage Vgs and the threshold voltage Vth of driving transistor DT, as described in Equation 1.

The driving transistor DT includes a gate electrode GE coupled to a first node N1, a first electrode coupled to a second node N2, and a drain electrode coupled to a third node N3. The first and second electrodes are source and drain electrodes. For example, if the first electrode is the source electrode, the second electrode may be the drain electrode, or vice versa.

The gate electrode GE of the driving transistor DT may include first and second gate electrodes GE1 and GE2, as shown, for example, in FIG. 5. The first gate electrode GE1 is disposed under and overlaps an active layer of the driving transistor DT. Also, referring to FIGS. 10 and 11, a first gate insulator may be formed between the first gate electrode GE1 and the active layer of the driving transistor DT, with the first gate electrode GE1 formed as a first gate metal pattern.

The second gate electrode GE2 is disposed over and overlaps the active layer of the driving transistor DT. Also, referring to FIGS. 10 and 11, a second gate insulator may be formed between the second gate electrode GE2 and the active layer of the driving transistor DT, with the second gate electrode GE1 formed as a second gate metal pattern.

Thus, in this embodiment, the driving transistor DT has a double-gate structure, e.g., one having two gate electrodes GE1 and GE2. Such a structure may increase mobility of the driving transistor DT, and thus may solve that a threshold voltage sensing period is insufficient when a display device has a high resolution. Also, in this embodiment, black leakage current may be reduced or minimized, to thereby allow a peak black grayscale to be accurately represented, which may result in improved contrast ratio.

The OLED emits light depending on the drain-to-source current Ids of the driving transistor DT. The luminance of light emitted by the OLED is proportional to the drain-to-source current Ids of the driving transistor DT. An anode of the OLED is coupled to a second electrode of the sixth transistor ST6 and a first electrode of the fourth transistor ST4. A cathode of the OLED is coupled to a third power voltage line VSSL supplying a third power voltage.

The first transistor ST1 is coupled between the first node N1 and the third node N3. The first transistor ST1 is turned on by the scan signal from the k-th scan line SLk. When the first transistor ST1 is turned on, the first node N1 is coupled to the third node N3, thus the driving transistor DT is in a diode-coupled state. The first transistor ST1 has a gate electrode coupled to the k-th scan line SLk, a first electrode coupled to the third node N3, and a second electrode coupled to the first node N1.

The second transistor ST2 is coupled between the second node N2 and the j-th data line DLj. The second transistor ST2 is turned on by the scan signal from the k-th scan line SLk. When the second transistor ST2 is turned on, the second node N2 is coupled to the data line DL. As a result, data voltage Vdata from the j-th data line DLj is supplied to the second node N2. The second transistor ST2 has a gate electrode coupled to the k-th scan line SLk, a first electrode coupled to the j-th data line DLj, and a second electrode coupled to the second node N2.

The third transistor ST3 is coupled between the first node N1 and first power voltage line ViniL supplying a first power voltage. The third transistor ST3 is turned on by a scan signal from the (k−1)-th line SLk−1. When the third transistor ST3 is turned on, the first node N1 is coupled to the first power voltage line ViniL. As a result, the first node N1 is initialized to the first power voltage. The third transistor ST3 has a gate electrode coupled to the (k−1)-th scan line SLk−1, a first electrode coupled to the first node N1, and a second electrode coupled to the first power voltage line ViniL.

The fourth transistor ST4 is coupled between the anode of the OLED and the first power voltage line ViniL. The fourth transistor is turned on by the scan signal from the (k−1)-th scan line. When the fourth transistor ST4 is turned on, the anode of the OLED is coupled to the first power voltage line ViniL. As a result, the anode of the OLED is initialized to the first power voltage. The fourth transistor ST4 has a gate electrode coupled to the (k−1)-th scan line SLk−1, a first electrode coupled to the anode of the OLED, and a second electrode coupled to the first power voltage line ViniL.

The fifth transistor ST5 is coupled between the second node N2 and the second power voltage line VDDL supplying a second power voltage. The fifth transistor ST5 is turned on by an emission signal from the k-th emission line EMLk. When the fifth transistor ST5 is turned on, the second node N2 is coupled to the second power voltage line VDDL. As a result, the second power voltage is supplied to the second node N2. The fifth transistor ST5 has a gate electrode coupled to the k-th emission line EMLk, a first electrode coupled to the second power voltage line VDDL, and a second electrode coupled to the second node N2.

The sixth transistor ST6 is coupled between the third node N3 and the anode of the OLED. The sixth transistor ST5 is turned on by the emission signal from the k-th emission line EMLk. When the sixth transistor ST6 is turned on, the third node N3 is coupled to the anode of the OLED. The sixth transistor ST6 has a gate electrode coupled to the k-th emission line EMLk, a first electrode coupled to the third node N3, and a second electrode coupled to the anode of OLED. When the fifth and sixth transistors are turned-on, the drain-to-source current Ids of the driving transistor DT is supplied to the OLED.

The storage capacitor C is coupled between the first node N1 and the second power voltage line VDDL. For example, one electrode of the storage capacitor C may be coupled to first gate electrode GE1 of the driving transistor DT. The other electrode of the storage capacitor C may be the second power voltage line VDDL.

A parasitic capacitance Coled of the OLED may be formed between the anode and the cathode of the OLED. Also, a parasitic capacitance PC may be formed between the first gate electrode GE1 of the driving transistor DT and the anode of the OLED. A voltage of the anode of the OLED may be influenced by a voltage change of the first gate electrode GE1 of the driving transistor DT by the parasitic capacitance PC.

For example, the voltage of the anode of the OLED may be increased by the parasitic capacitance PC. As a result, the third power voltage of the third power voltage line VSSL may be influenced by a voltage change of the anode of the OLED. That is, the third power voltage of the third power voltage line VSSL may be increased by the parasitic capacitance Coled of the OLED. Also, the color of the display panel 10 may be shifted when the third power voltage is increased.

Therefore, the aforementioned embodiment may reduce or minimize parasitic capacitance PC, in order to reduce or minimize the voltage change of the anode of the OLED by parasitic capacitance PC.

The first node N1 is a gate node coupled to gate electrode GE of driving transistor DT. The first node N1 is a contact point at which the gate electrode GE of the driving transistor DT, second electrode of first transistor ST2, the first electrode of third transistor ST3 are mutually electrically coupled.

The second node N2 is a source node coupled to the first electrode of the driving transistor DT. The second node N2 is a contact point at which the first electrode of the driving transistor DT, the second electrode of the second transistor ST2, and the second electrode of the fifth transistor ST5 are mutually electrically coupled.

The third node N3 is a drain node coupled to the second electrode of the driving transistor DT. The third node N3 is a contact point at which the second electrode of the driving transistor DT, first electrode of the first transistor ST1, and the first electrode of the sixth transistor ST5 are mutually electrically coupled.

Active layers of the first to sixth transistors ST1 to ST6 and the driving transistor DT have been described as being formed of Poly-Si by a low temperature Poly-Si (LTPS) process. In alternative embodiments, the active layers of the first to sixth transistors ST1 to ST5 and the driving transistor DT may be formed of either a-Si, an oxide semiconductor, or other suitable semiconductor material.

Also, transistors of the aforementioned embodiment are P-type transistors. In alternative embodiments, the transistors may be N-type transistors. In an N-type transistor implementation, it is understood that the waveform diagram in FIG. 6 may be modified to be consistent with characteristics of N-type transistors.

The first to third power voltages are set taking into consideration the characteristics of the driving transistor DT and first to sixth transistors ST1 to ST6, the characteristics of the organic light emitting diode OLED, and/or one or more other pixel elements.

Figure 6:
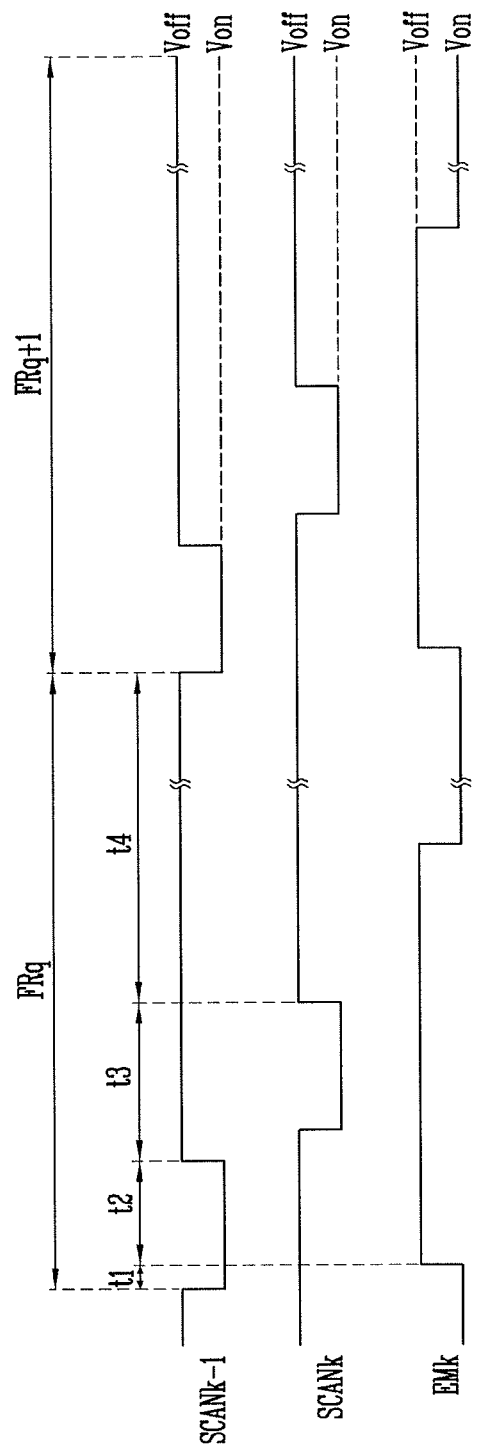
FIG. 6 illustrates an example of signals for controlling the pixel.

FIG. 6 illustrates an example of signals for controlling a pixel, which, for example, may be the pixel in FIG. 5. FIG. 6 depicts a (k−1)-th scan signal SCANk−1 of the (k−1)-th scan line SLk−1, a k-th scan signal SCANk of the k-th scan line SLk and a k-th emission signal EMk of the k-th emission line EMLk during q-th and (q+1)-th frame periods, where q is a positive integer.

Referring to FIG. 6, the (k−1)-th scan signal SCANk−1 controls the third and fourth transistors ST3 and ST4, the k-th scan signal SCANk controls the first and second transistors ST1 and ST2, and the k-th emission signal EMk controls the fifth and sixth transistors ST5 and ST6. Each scan signal and each emission signal may have a cycle of one frame period.

Each scan signal may have a gate-on voltage Von during one horizontal period. In one embodiment, one horizontal period may correspond to a period that supplies data voltages to pixels arranged on a horizontal line. The pixels arranged on a horizontal line may refer to pixels coupled to as same scan line, but this is not a necessity. The data voltages are supplied in synchronism with the gate-on voltage Von of each scan signal.

In the present embodiment, one frame period includes first to fourth periods t1 to t4. In the first period t1, driving transistor DT is turned on and may be placed in an on-bias state in the period t3. In the second period t2, the first node N1 is initialized. In the period t3, a data voltage is supplied to the first node N1. In the period t4, the OLED emits light depending on the drain-to-source current Ids of the driving transistor DT.

The (k−1)-th scan signal SCANk−1 may have a gate-on voltage Von during the first and second periods t1 and t2 and a gate-off voltage Voff during the third and fourth periods t3 and t4. The k-th scan signal SCANk may have a gate-on voltage Von during the third period t3 and a gate-off voltage Voff during the first, second, and fourth periods t1, t2, and t4. The k-th emission signal may have a gate-on voltage Von during the first and fourth periods t1 and t4 and a gate-off voltage Voff during the second and third periods t2 and t3. A gate-on voltage Von refers to a voltage for turning on the first to sixth transistors ST1 to ST6, and a gate-off voltage Voff refers to a voltage for turning off the first to sixth transistors ST1 to ST6.

Figure 7:
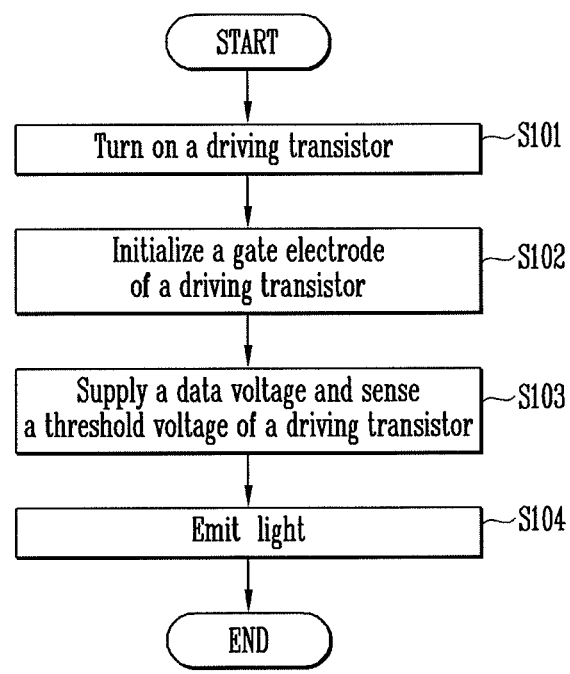
FIG. 7 illustrates an embodiment of a method for driving a pixel.

FIG. 7 illustrates an embodiment of a method for driving a pixel, which, for example, may be the pixel of FIG. 5. FIGS. 8A to 8D are circuit diagrams showing operation of the pixel during first to fourth periods. The method for driving the pixel according to this embodiment during the first to fourth periods t1 to t4 is described in detail in conjunction with FIGS. 6, 7, and 8A to 8D.

First, as shown in FIG. 6, during the first period t1, the driving transistor DT is turned on, and the (k−1)-th scan signal SCANk−1 having gate-on voltage Von and the k-th emission signal EMk having gate-on voltage Von are supplied to the pixel. The k-th scan signal SCANk having gate-off voltage Voff is supplied to the pixel during the first period t1.

Figure 8A:
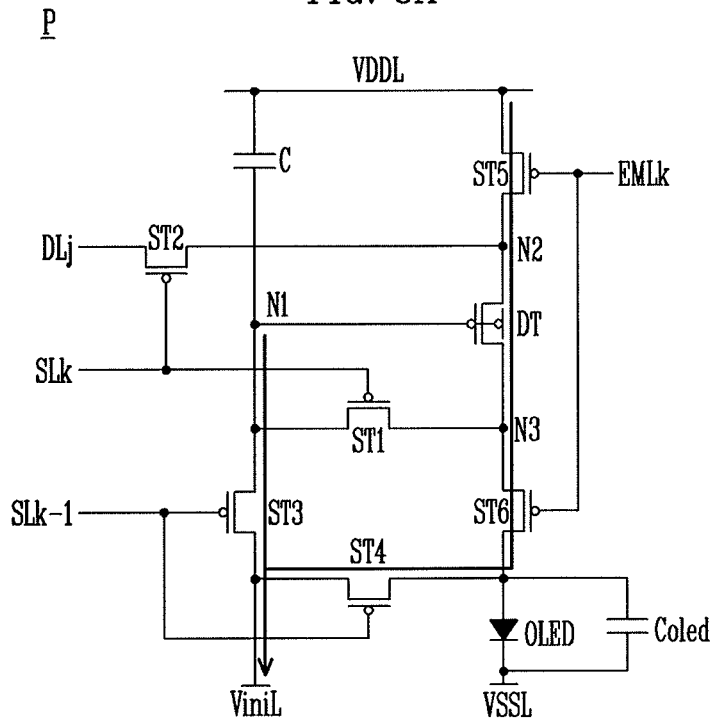
FIGS. 8A to 8D illustrate operation of a pixel according to one embodiment.

Referring to FIG. 8A, in the first period t1, the third and fourth transistors ST3 and ST4 are turned on by the (k−1)-th scan signal SCANk−1 having gate-on voltage Von. The fifth and sixth transistors ST5 and ST6 are turned on by the k-th emission signal EMk having gate-on voltage Von. The first and second transistors ST1 and ST2 are turned off by the k-th scan signal SCANk having gate-off voltage Voff.

The first node N1 is initialized to the first power voltage of first power voltage line ViniL, because third transistor ST3 is turned on during the first period t1. Also, the driving transistor DT may be turned on, based on the on-bias voltage supplied to the gate electrode of driving transistor DT.

More specifically, the driving transistor DT may be turned on because the gate-source voltage "Vini−Vdd" of driving transistor DT is less than a threshold voltage of the driving transistor DT. Here, Vini refers to the first power voltage and Vdd refers to the second power voltage. Thus, in this case, when second power voltage Vdd is supplied to the first electrode of driving transistor DT and the first power voltage Vini is supplied to the gate electrode of driving transistor DT, the first power voltage Vini may be an on-bias voltage. Therefore, the drain-to-source current Ids of the driving transistor DT may flow according to a gate-source voltage "Vini−Vdd" of driving transistor DT.

In the present embodiment, the driving transistor DT may be turned on and the drain-to-source current Ids of the driving transistor DT may flow during the first period t1. As a result, the driving transistor DT may be in the on-bias state during the third period, in which a data voltage is supplied. Accordingly, a degradation in picture quality may be prevented as a result of hysteresis characteristics of the driving transistor DT.

Also, in the present embodiment, the drain-to-source current Ids of the driving transistor DT may flow to the first power voltage line ViniL by turning on the fourth transistor ST4 during the first period t1 (See S101 in FIG. 7). Therefore, the OLED may be prevented from emitting light during the first period t1.

Second, as shown in FIG. 6, in the second period t2, the first node N1 is initialized and the (k−1)-th scan signal SCANk−1 having gate-on voltage Von is supplied to the pixel. Thus, the gate electrode of the driving transistor DT, connected to the first node N1, is initialized (See S102 in FIG. 7). The k-th scan signal SCANk having gate-off voltage Voff and the k-th emission signal EMk having gate-off voltage Voff are supplied to the pixel during the second period t2.

Figure 8B:
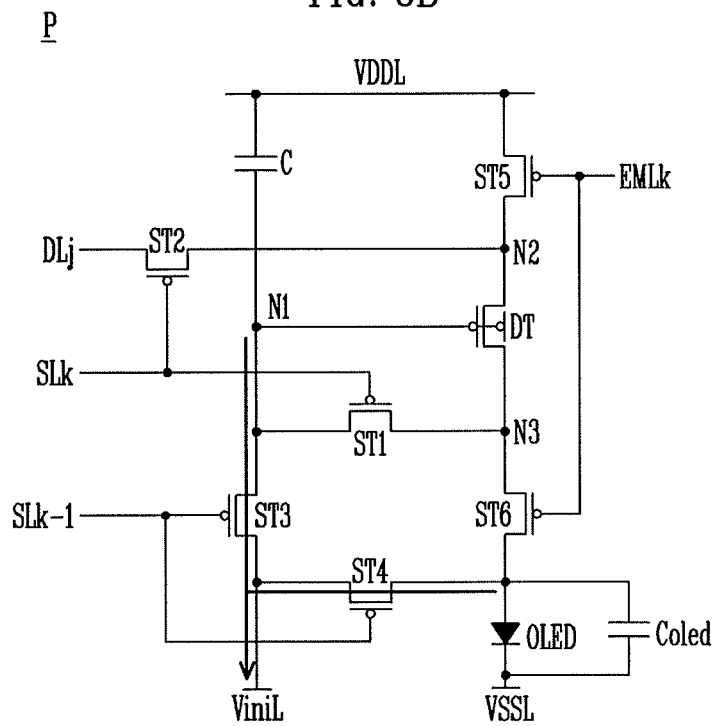

Referring to FIG. 8B, the third and fourth transistors ST3 and ST4 are turned on by the (k−1)-th scan signal SCANk−1 having gate-on voltage Von. The first and second transistors ST1 and ST2 are turned off by the k-th scan signal SCANk having gate-off voltage Voff. The fifth and sixth transistors ST5 and ST6 are turned off by the k-th emission signal EMk having gate-off voltage Voff.

The first node N1 is initialized to the first power voltage of first power voltage line ViniL, because third transistor ST3 is turned on during the second period t2. Also, the anode of the OLED is initialized to the first power voltage of the first power voltage line ViniL, because the fourth transistor ST4 is turned on during the second period t2. The first power voltage may be substantially same as the third power voltage, to prevent the OLED from emitting light.

Third, as shown in FIG. 6, in third period t3, a data voltage is supplied to the first node N1 and the k-th scan signal SCANk having gate-on voltage Von is supplied to the pixel. The (k−1)-th scan signal SCANk−1 having gate-off voltage Voff and the k-th emission signal EMk having gate-off voltage Voff are supplied to the pixel during the third period t3.

Figure 8C:
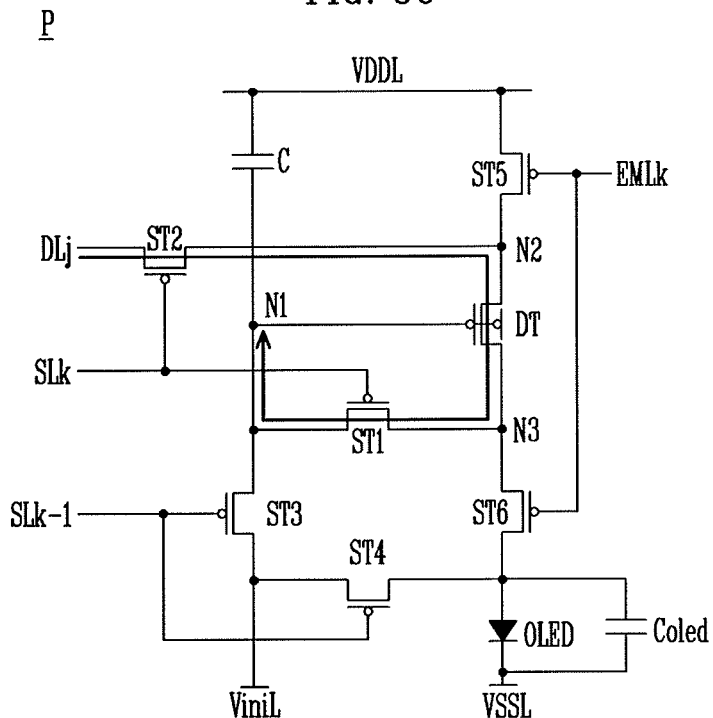

Referring to FIG. 8C, the first and second transistors ST1 and ST2 are turned on by the k-th scan signal SCANk having gate-on voltage Von. The third and fourth transistors ST3 and ST4 are turned off by the (k−1)-th scan signal SCANk−1 having gate-off voltage Voff. The fifth and sixth transistors ST5 and ST6 are turned off by the k-th emission signal EMk having gate-off voltage Voff.

The first node N1 is electrically coupled to the third node N3 because the first transistor ST1 is turned on. As a result, the driving transistor DT is in a diode-coupled state. Also, the second node N2 is electrically coupled to the j-th data line Dj because the second transistor ST2 is turned on. As a result, a data voltage of the j-th data line Dj is supplied to the second node N2.

The drain-to-source current Ids of the driving transistor DT flows until the gate-source voltage of the driving transistor DT reaches the threshold voltage of the driving transistor DT. This is because the gate-source voltage "Vini−Vdata" is less than the threshold voltage of the driving transistor DT. Therefore, the voltage of the first node N1 rises up to "Vdata+Vth." The voltage "Vdata+Vth" of the first node N1 is stored in the capacitor C. The threshold voltage Vth of the driving transistor DT may be sensed by the storage capacitor C during the third period t3. (See S103 in FIG. 7). Vdata refers to the data voltage and Vth refers to the threshold voltage of the driving transistor DT.

Fourth, as shown in FIG. 6, in the fourth period t4, the OLED emits light (See S104 in FIG. 7). The k-th emission signal EMk having the gate-on voltage Von is supplied to the pixel P. The (k−1)-th scan signal SCANk−1 having the gate-off voltage Voff and the k-th scan signal SCANk having the gate-off voltage Voff are supplied to the pixel P during the fourth period t4.

Figure 8D:
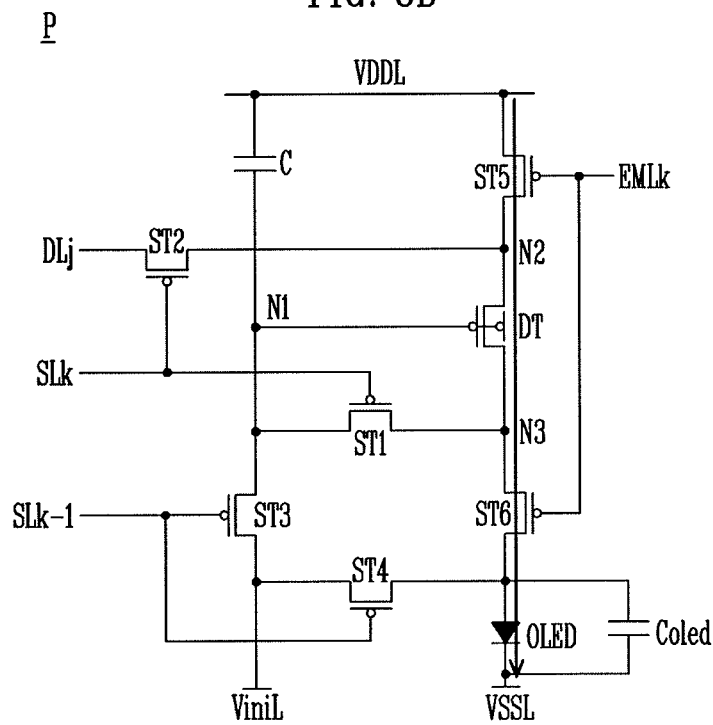

Referring to FIG. 8D, the fifth and sixth transistors ST5, ST6 are turned on by the k-th emission signal EMk having the gate-on voltage Von. The third and fourth transistors ST3 and ST4 are turned off by the (k−1)-th scan signal SCANk−1 having the gate-off voltage Voff. The first and second transistors ST1 and ST2 are turned off by the k-th scan signal SCANk having the gate-off voltage Voff.

The second node N2 is electrically coupled to the second power voltage line VDDL, because the fifth transistor ST5 is turned on. The third node N3 is electrically coupled to the anode of the OLED because the sixth transistor ST6 is turned on. Therefore, the drain-to-source current Ids of the driving transistor DT is supplied to the OLED. Because the voltage "Vdata+Vth" of the first node N1 is stored to the storage capacitor C, the drain-to-source current Ids of the driving transistor DT may be expressed in following equation:

$$I_{ds}=k\cdot(V_{gs}-V_{th})^2=k\cdot(Vdd-(V\text{data}-Vth)-Vth)^2 \quad (2)$$

where k' is a proportionality coefficient determined by the structure and physical properties of the driving transistor DT, Vgs is the gate-source voltage of the driving transistor DT, Vth is the threshold voltage of the driving transistor DT, Vdata is the data voltage, and the Vdd is the second power voltage. The gate voltage Vg of the driving transistor DT is Vdata+Vth, and the source voltage Vs of the driving transistor DT is Vdd during the fourth period t4.

The drain-to-source current Ids of the driving transistor DT may be simplified by the following equation:

$$I_{ds}=k\cdot(Vdd-V\text{data})^2 \quad (3)$$

From Equation 3, is apparent that the drain-to-source current Ids does not depend on the threshold voltage Vth of the driving transistor DT. Thus, the present embodiment may compensate the threshold voltage Vth of the driving transistor DT.

Figure 9:
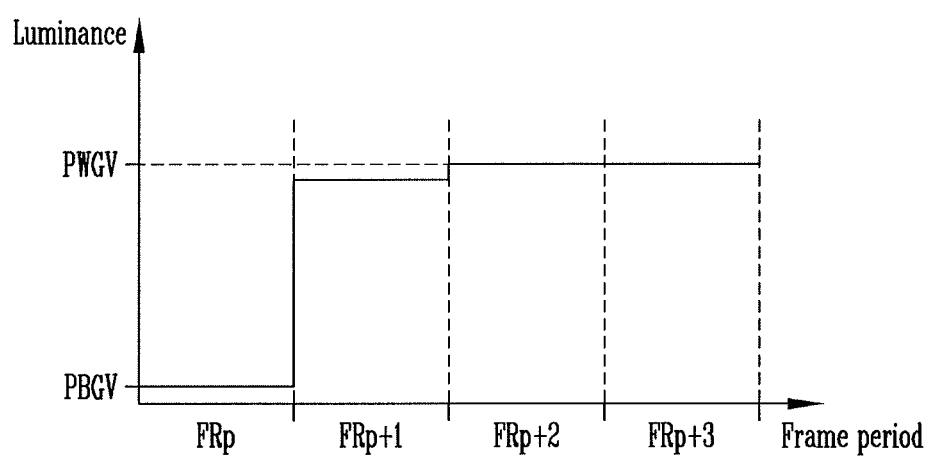
FIG. 9 illustrates luminance of a pixel when a peak black grayscale voltage is supplied during a p-th frame period and peak white grayscale voltages are supplied during (p+1)-th to (p+3)th frame periods according to one embodiment.

FIG. 9 illustrates the luminance of a pixel when a peak black grayscale voltage is supplied during a p-th frame period and peak white grayscale voltages are supplied during (p+1)-th to (p+3)th frame periods according to one embodiment. In FIG. 9, the p-th frame period FRp refers to a peak black grayscale display period in which pixels P are represented as a peak black grayscale value. Each of the (p+1)-th to (p+3)th frame periods FRp+1 to FRp+3 refers to a peak white grayscale display period, in which the pixels P are represented as a peak white grayscale value.

In this embodiment, the driving transistor DT may be turned on by initializing the gate electrode GE of the driving transistor DT to the first power voltage during the first period t1. As a result, the driving transistor DT may be in the same on-bias state during the third period t3 that supplies the data voltage to the gate electrode GE of the driving transistor DT, regardless of the data voltage supplied during a previous frame period.

For example, as shown in FIG. 9, even though the peak black grayscale voltage is supplied to the gate electrode GE of the driving transistor DT during the p-th frame period FRp, the driving transistor DT is in the on-bias state during the third period t3 of the (p+1)-th frame period FRp+1 that supplies the data voltage. This is because the driving transistor DT is turned on and the drain-to-source current Ids of the driving transistor DT flows during the first period t1 of the (p+1)-th frame period FRp+1. Therefore, the drain-to-source current Ids of the driving transistor DT during the (p+1)-th frame period FRp+1 is almost same as during the (p+2)-th frame period FRp+2. As a result, the OLED may emit the peak white grayscale value during the (p+1)-th frame period FRp+1.

Accordingly, the present embodiment may prevent or reduce the degree of the drain-to-source current of the driving transistor DT increasing in steps (e.g., increasing incrementally for subsequent frame periods) due to the hysteresis characteristics of the driving transistor in the case of displaying a white grayscale image after displaying a black grayscale image. As a result, the luminance difference may be reduced or minimized between white grayscale images caused by the hysteresis characteristics of the driving transistor, in the case of displaying a white grayscale image after displaying a black grayscale image. Accordingly, picture quality may be improved.

Figure 10:
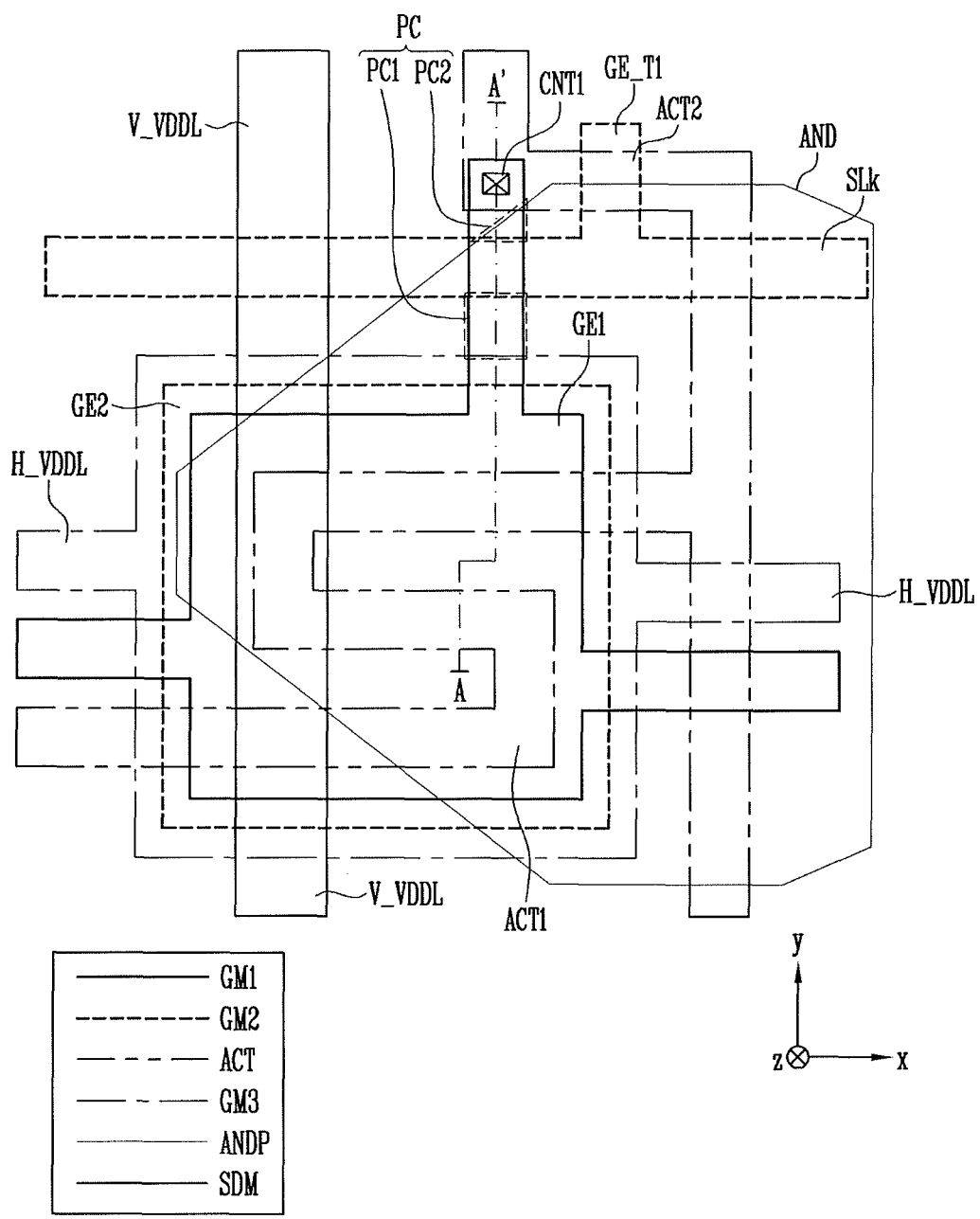
FIG. 10 illustrates an example of a driving transistor and first transistor in FIG. 5.
Figure 11:
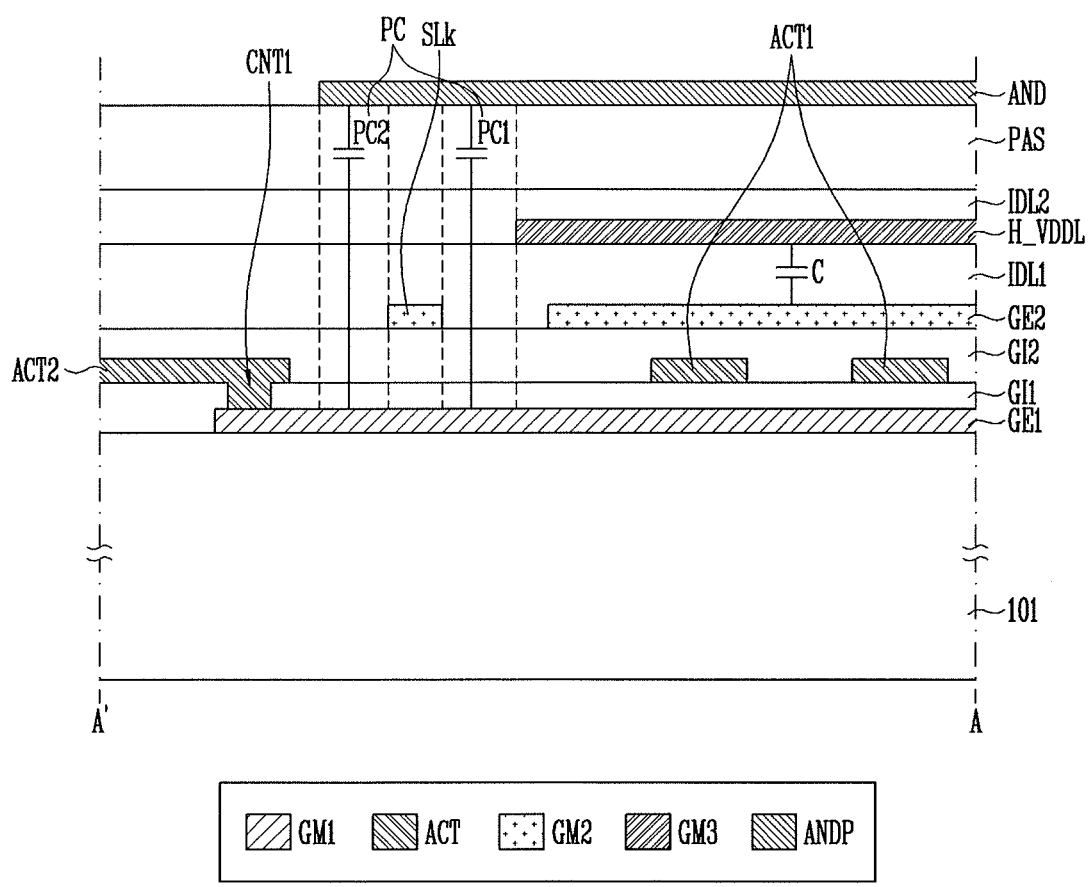
FIG. 11 illustrates a view along section line A-A' in FIG. 10.

FIG. 10 illustrates an example of a driving transistor and a first transistor of FIG. 5, and FIG. 11 is view taken along section line A-A' in FIG. 10. The connection between the gate electrode GE of the driving transistor DT and an active layer ACT2 of the first transistor ST1 is described in these figures.

Referring to FIGS. 10 and 11, a first metal pattern GM1 including a first gate electrode GE1 of the driving transistor DT is formed on a lower substrate 101 of the display panel 10. Alternatively, the first metal pattern GM1 may be formed on a buffer layer of the lower substrate 101. The first metal pattern GM1 may be formed, for example, to include Mo (molybdenum).

A first gate insulator GI1 is formed on the first metal pattern GM1. The first gate insulator GI1 may be formed, for example, to include SiNx (silicon nitride).

An active pattern ACT including an active layer ACT1 of the driving transistor DT and the active layer ACT2 of the first transistor ST1 is formed on the first gate insulator GI1. The active pattern ACT is formed, for example, of poly-silicon, a-si, or an oxide. The active pattern ACT is isolated from the first gate metal pattern GM1 by the first gate insulator GI1. However, the active layer ACT2 of the first transistor ST1 is coupled to the first gate electrode GE1 of the driving transistor DT through a first contact hole CNT1. The first contact hole CNT1 penetrates the first insulator GI1 to expose the first gate electrode GE1 of the driving transistor DT.

A second insulator GI2 is formed on the active pattern ACT. The second insulator GI2 may be formed, for example, to include SiNx (silicon nitride).

A second gate metal pattern GM2 including a second gate electrode GE2 of the driving transistor DT and the k-th scan line SLk is formed on the second gate insulator GI2. The active pattern ACT is isolated from the second gate metal pattern GM2 by the second gate insulator GI2. (FIGS. 10 and 11 do not depict a connection between first and second gate electrodes GE1 and GE2 of the driving transistor DT. However, the second gate electrode GE2 of the driving transistor DT may be coupled to the first gate electrode GE1 of the driving transistor DT through a second contact hole.) The second contact hole penetrates the first and second gate insulators GI1 and GI2 to expose the first gate electrode GE1 of the driving transistor DT. The second metal pattern GM2 may be formed, for example, to include Mo (molybdenum).

A first layer insulator ILD1 is formed on the second gate metal pattern GM2. The first layer insulator ILD1 may be formed, for example, to include SiNx (silicon nitride).

A third gate metal pattern GM3 including a horizontal second power voltage line H_VDDL is formed on the first layer insulator ILD1. The third gate metal pattern GM3 is isolated from the first gate metal pattern GM1 by the first gate insulator GI1.

A second layer insulator ILD2 is formed on the third gate metal pattern GM3. The second layer insulator ILD2 may be formed, for example, as a double layer having a SiNx (silicon nitride) layer and a SiO2 (silicon dioxide) layer.

A source/drain metal pattern SDM including a vertical second power voltage line V_VDDL is formed on the second layer insulator ILD2. The source/drain metal pattern SDM is isolated from the third gate metal pattern by the second layer insulator ILD2. The source/drain metal pattern SDM may be formed, for example, as a triple layer having a Ti (Titanium) layer, an Al (Aluminum) layer and a Ti (Titanium) layer.

The second power voltage line VDDL includes the horizontal second power voltage line H_VDDL and the vertical second power voltage line V_VDDL. The horizontal second power voltage line H_VDDL may be parallel to a horizontal direction (x-axis direction). The vertical second power voltage line V_VDDL may be parallel to a vertical direction (y-axis direction). The horizontal second power voltage line H_VDDL may be coupled to the vertical second power voltage line V_VDDL through a third contact hole. The third contact hole penetrates the second layer insulator IDL2 to expose the horizontal second power voltage line H_VDDL. Also, the area of overlap area between the horizontal second power voltage line H_VDDL and the second gate electrode GE2 of the driving transistor DT functions as the storage capacitor C.

A passivation layer PAS is formed on the source/drain metal pattern SDM. The passivation layer PAS is formed, for example, to include polyimide.

An anode pattern ANDP including the anode of the OLED is formed on the passivation layer PAS. The anode pattern ANDP is isolated from the source/drain metal pattern SDM by the passivation layer PAS. The anode pattern ANDP is formed, for example, as a triple layer having a ITO (indium tin oxide) layer, an Ag (argent) layer and a ITO (indium tin oxide) layer.

Referring to FIGS. 5, 6, 10 and 11, a voltage of the anode of the OLED may be increased by a parasitic capacitance PC formed between the first gate electrode GE1 of the driving transistor DT and the anode of the OLED. This is because the anode of the OLED is in a floating state during the second and third periods t2 and t3. The floating state may include a state in which no voltage is supplied to the anode of the OLED, so the anode of the OLED in the floating state readily affects a voltage change of an adjacent node.

Also, due to a voltage change of the anode of the OLED, the third power voltage of the third power voltage line VSSL may be increased by the parasitic capacitance Coled of the OLED formed between the anode and cathode of the OLED. Thus, color of the display panel 10 may be shifted when the third power voltage is increased. Therefore, the parasitic capacitance PC between the first gate electrode GE1 of the driving transistor DT and the anode of the OLED may be reduced or minimized, to thereby prevent a color shift in the display panel 10.

In the present embodiment, the first gate electrode GE1 of the driving transistor DT may be coupled to the active layer ACT2 of the first transistor ST1 by extending the length of the first gate electrode GE1 of the driving transistor DT. Even though the parasitic capacitance PC between the first gate electrode GE1 of the driving transistor DT and the anode of the OLED is formed, the first gate electrode GE1 of the driving transistor DT is far from the anode of the OLED, because the first gate electrode GE1 of the driving transistor DT is formed under the active pattern. Also, an area of overlap between the anode of the OLED and the first gate electrode GE1 of the driving transistor DT is very small. Therefore, the parasitic capacitance PC may be substantially reduced.

For example, in the present embodiment, parasitic capacitance PC between the first gate electrode GE1 of the driving transistor DT and the anode of the OLED may be reduced or minimized. As a result, the voltage increase of the anode of the OLED due to the parasitic capacitance PC may be reduced or minimized. As a result, Therefore, an increase in the third power voltage may be reduced or prevented, along with a color shift of the display panel 10.

Figure 12:
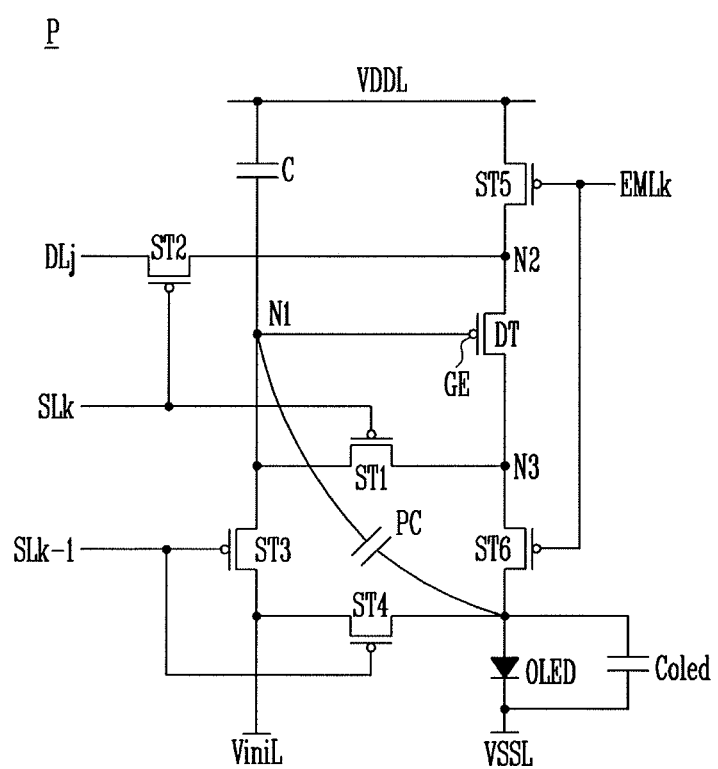
FIG. 12 illustrates another embodiment of a pixel.

FIG. 12 illustrates another embodiment of a pixel P which includes a driving transistor DT, an OLED, switch elements, and a storage capacitor C. The switch elements include first to fifth transistors ST1 to ST6.

In this embodiment, the gate electrode GE of the driving transistor DT may be disposed under an active layer of the driving transistor DT. The gate electrode GE of the driving transistor DT overlaps the active layer of the driving transistor DT. For example, the driving transistor DT may be formed as a bottom gate structure having one gate electrode under the active layer.

The pixel P may be substantially same as the pixel in FIG. 5, except for the bottom gate structure of the driving transistor DT. Also, a (k−1)-th scan signal SCANk−1, a k-th scan signal SCANk, and a k-th emission signal EMk supplied to pixel P may be substantially the same as in FIG. 6. Also, operation of the pixel P may be substantially same as operation of the pixel P in FIGS. 7 and 8A to 8D.

Figure 13:
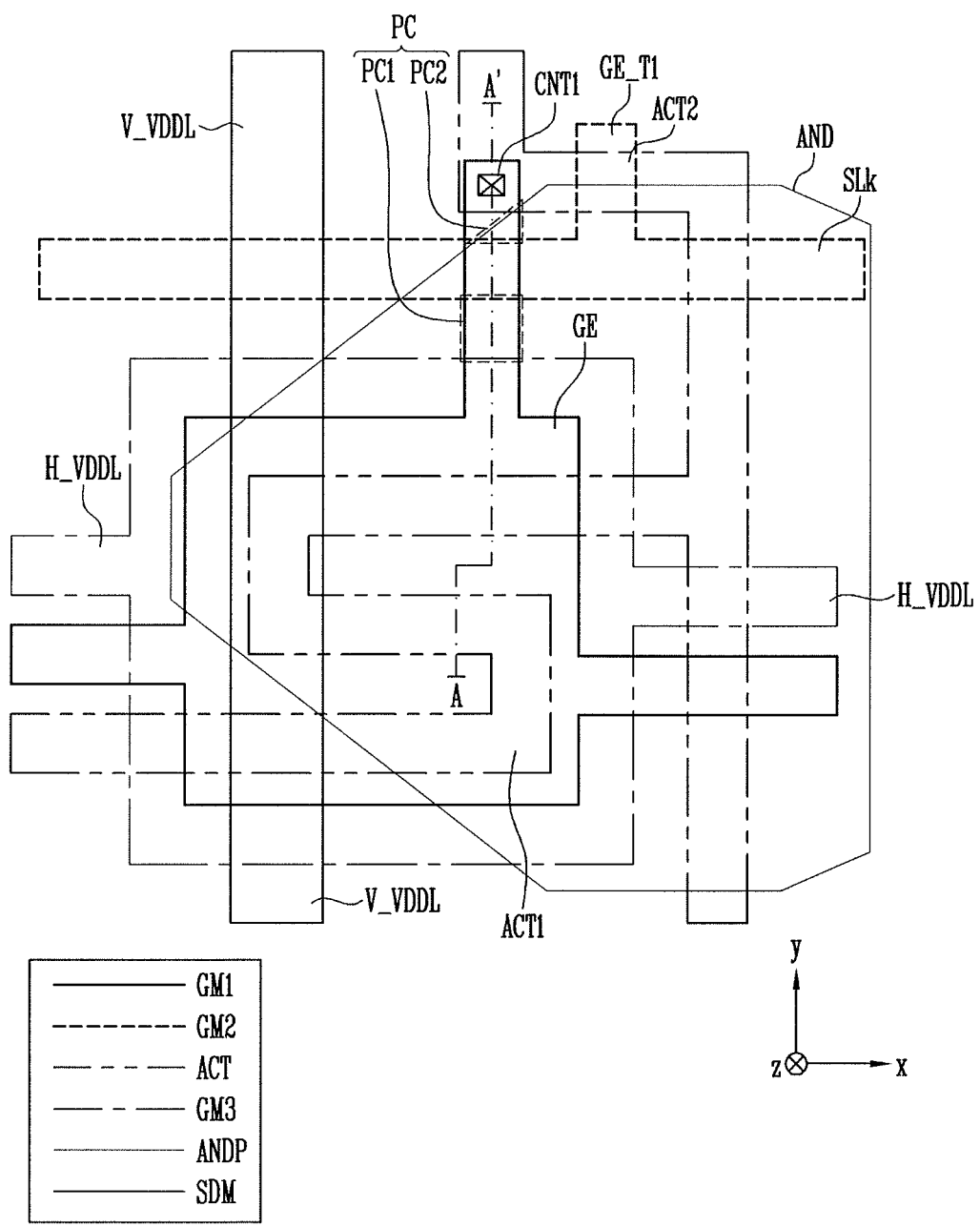
FIG. 13 illustrates an example of a driving transistor and a first transistor in FIG. 12.
Figure 14:
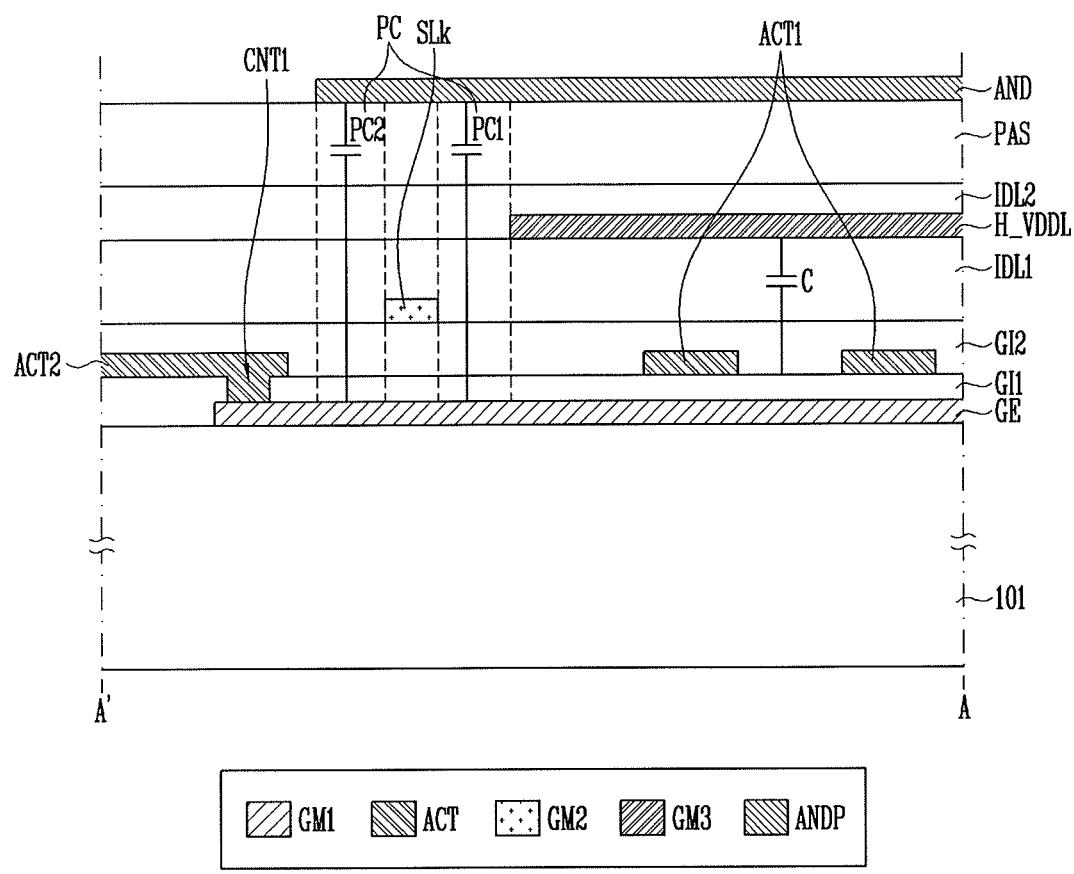
FIG. 14 illustrates a view along section line B-B' in FIG. 13.

FIG. 13 illustrates an example of a driving transistor and a first transistor in FIG. 12 and FIG. 14 is view taken along section line B-B' in FIG. 13. The connection between the gate electrode GE of the driving transistor DT and an active layer ACT2 of the first transistor ST1 is described in these figures.

Referring to FIGS. 13 and 14, a first metal pattern GM1 including a gate electrode GE of the driving transistor DT is formed on a lower substrate 101 of the display panel 10. Alternatively, the first metal pattern GM1 may be formed on a buffer layer of the lower substrate 101. The first metal pattern GM1 may be formed, for example, to include Mo (molybdenum).

A first gate insulator GI1 is formed on the first metal pattern GM1. The first gate insulator GI1 may be formed, for example, to include SiNx (silicon nitride).

An active pattern ACT including an active layer ACT1 of the driving transistor DT and the active layer ACT2 of the first transistor ST1 is formed on the first gate insulator GI1. The active pattern ACT is formed, for example, of poly-silicon, a-si, or an oxide. The active pattern ACT is isolated from the first gate metal pattern GM1 by the first gate insulator GI1. However, the active layer ACT2 of the first transistor ST1 is coupled to the gate electrode GE of the driving transistor DT through a first contact hole CNT1. The first contact hole CNT1 penetrates the first insulator GI1 to expose the gate electrode GE of the driving transistor DT.

A second insulator GI2 is formed on the active pattern ACT. The second insulator GI2 may be formed, for example, to include SiNx (silicon nitride).

A second gate metal pattern GM2 including the k-th scan line SLk is formed on the second gate insulator GI2. The active pattern ACT is isolated from the second gate metal pattern GM2 by the second gate insulator GI2. The second metal pattern GM2 may be formed, for example, to include Mo (molybdenum).

A first layer insulator ILD1 is formed on the second gate metal pattern GM2. The first layer insulator ILD1 may be formed, for example, to include SiNx (silicon nitride).

A third gate metal pattern GM3 including a horizontal second power voltage line H_VDDL is formed on the first layer insulator ILD1. The third gate metal pattern GM3 is isolated from the first gate metal pattern GM1 by the first gate insulator GI1.

A second layer insulator ILD2 is formed on the third gate metal pattern GM3. The second layer insulator ILD2 may be formed, for example, as a double layer having a SiNx (silicon nitride) layer and a SiO2 (silicon dioxide) layer.

A source/drain metal pattern SDM including a vertical second power voltage line V_VDDL is formed on the second layer insulator ILD2. The source/drain metal pattern SDM is isolated from the third gate metal pattern by the second layer insulator ILD2. The source/drain metal pattern SDM may be formed, for example, as a triple layer having a Ti (Titanium) layer, an Al (Aluminum) layer, and a Ti (Titanium) layer.

The second power voltage line VDDL includes the horizontal second power voltage line H_VDDL and the vertical second power voltage line V_VDDL. The horizontal second power voltage line H_VDDL may be parallel to a horizontal direction (x-axis direction). The vertical second power voltage line V_VDDL may be parallel to a vertical direction (y-axis direction). The horizontal second power voltage line H_VDDL may be coupled to the vertical second power voltage line V_VDDL through a contact hole. The contact hole penetrates the second layer insulator IDL2 to expose the horizontal second power voltage line H_VDDL. Also, an area of overlap between the horizontal second power voltage line H_VDDL and the second gate electrode GE2 of the driving transistor DT functions as the storage capacitor C.

A passivation layer PAS is formed on the source/drain metal pattern SDM. The passivation layer PAS is formed, for example, to include polyimide.

An anode pattern ANDP including the anode of the OLED is formed on the passivation layer PAS. The anode pattern ANDP is isolated from the source/drain metal pattern SDM by the passivation layer PAS. The anode pattern ANDP is formed, for example, as a triple layer having a ITO (indium tin oxide) layer, an Ag (argent) layer and a ITO (indium tin oxide) layer.

Referring to FIGS. 6 and 12 to 14, a voltage of the anode of the OLED may be increased by a parasitic capacitance PC formed between the gate electrode GE of the driving transistor DT and the anode of the OLED. This is because the anode of the OLED is in a floating state during the second and third periods t2 and t3. The floating state may include a state in which no voltage is supplied to the anode of the OLED, so the anode of the OLED in the floating state readily affects a voltage change of an adjacent node.

Also, due to a voltage change of the anode of the OLED, the third power voltage of the third power voltage line VSSL may be increased by the parasitic capacitance Coled of the OLED formed between the anode and the cathode of the OLED. Thus, the color of the display panel 10 may be shifted when the third power voltage is increased. Therefore, the parasitic capacitance PC between the gate electrode GE of the driving transistor DT and the anode of the OLED may be reduced or minimized, to thereby prevent color shift in the display panel 10.

In accordance with one or more of the aforementioned embodiments, the gate electrode GE of the driving transistor DT may be coupled with the active layer ACT2 of the first transistor ST1. This may be accomplished by extending the length of the gate electrode GE of the driving transistor DT. Even though the parasitic capacitance PC between the gate electrode GE of the driving transistor DT and the anode of the OLED is formed, the gate electrode GE of the driving transistor DT is far from the anode of the OLED, because the gate electrode GE of the driving transistor DT is formed under the active pattern. Also, an area of overlap between the anode of the OLED and the gate electrode GE of the driving transistor DT is very small. Therefore, the parasitic capacitance PC may be substantially reduced.

For example, parasitic capacitance PC between the gate electrode GE of the driving transistor DT and the anode of the OLED may be reduced or minimized. As a result, a voltage increase of the anode of the OLED due to the parasitic capacitance PC may be reduced or minimized. Therefore, an increase in the third power voltage may be reduced or minimized, thus preventing color shift in the display panel 10.

In accordance with one or more of the aforementioned embodiments, an organic light emitting display device and a method for driving the same is provided which compensates for the threshold voltage of the driving transistor and minimizes or reduces luminance difference between pixels of a display panel.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting display device, comprising:
a display panel including data lines, scan lines, and a plurality of pixels,
wherein each of the pixels includes:
a driving transistor configured to control an amount of drain-to-source current flowing from a first electrode to a second electrode according to a voltage applied to a first gate electrode;
an organic light emitting diode (OLED) configured to emit light depending on the drain-to-source current of the driving transistor; and
a first transistor coupled between the first gate electrode and the second electrode of the driving transistor, wherein the first gate electrode is under an active layer of the driving transistor and wherein the first gate electrode overlaps the active layer of the driving transistor.

2. The display device as claimed in claim 1, wherein a part of the first gate electrode overlaps a part of an anode of the OLED.

3. The display device as claimed in claim 2, wherein the first gate electrode is coupled to an active layer of the first transistor through a first contact hole.

4. The display device as claimed in claim 3, further comprising:
an insulator covering the first gate electrode,
wherein the first contact hole penetrates the insulator to expose the first gate electrode.

5. The display device as claimed in claim 3, wherein:
the driving transistor includes a second gate electrode over the active layer of the driving transistor,
the second gate electrode overlaps the active layer of the driving transistor.

6. The display device as claimed in claim 5, wherein the first gate electrode is coupled to the second gate electrode through a second contact hole.

7. The display device as claimed in claim 6, wherein the second contact hole penetrates a plurality of insulators.

8. The display device as claimed in claim 3, wherein the active layer of the driving transistor and the active layer of the first transistor include polysilicon.

9. The display device as claimed in claim 1, wherein:
the display panel further includes emission lines, and
each of the pixels includes:
a second transistor coupled between a data line and the first electrode of the driving transistor;
a third transistor coupled between the first gate electrode and a first power voltage line to which a first power voltage is supplied;
a fourth transistor coupled to an anode of the OLED and the first power voltage line;
a fifth transistor coupled to the first electrode of the driving transistor and a second power voltage line to which a second power voltage is supplied; and
a sixth transistor coupled to the second electrode of the driving transistor and the anode of the OLED.

10. The display device as claimed in claim 9, wherein each of the pixels includes a capacitor between the first gate electrode and the second power voltage line.

11. The display device as claimed in claim 9, wherein:
a gate electrode of the first transistor and a gate electrode of the second transistor are coupled to a scan line,
a gate electrode of the third transistor and a gate electrode of the fourth transistor are coupled to another scan line, and
a gate electrode of the fifth transistor and a gate electrode of the sixth transistor are coupled to an emission line.

12. The display device as claimed in claim 11, wherein:
a scan signal from the another scan line has a gate-on voltage during first and second periods,
a scan signal from the scan line has a gate-on voltage during third period,
an emission signal from the emission line has a gate-on voltage during first and fourth periods.

13. The display device as claimed in claim 9, wherein a cathode of the OLED is coupled to a third power voltage line to which a second power voltage is supplied.

14. A pixel, comprising:
an organic light emitting diode (OLED);
a driving transistor to control an amount of current to the OLED; and
a first transistor coupled between two terminals of the driving transistor,
wherein the driving transistor has a double-gate structure including a first gate and a second gate, the first gate coupled to an active layer of the first transistor and the second gate overlapping the first gate, and wherein an active layer of the driving transistor is between the first and second gates.

15. The pixel as claimed in claim 14, wherein:
the first gate has a first length, and
the second gate has a second length less than the first length.

16. The pixel as claimed in claim 15, wherein:
the first gate is spaced from a terminal of the OLED by a first distance, and
the second gate is spaced from the terminal of the OLED by a second distance less than the first distance.

17. The pixel as claimed in claim 14, further comprising:
a first insulator between the first gate and active layer of the driving transistor, and
a second insulator between the second gate and active layer of the driving transistor.

18. The pixel as claimed in claim 14, wherein the second gate does not overlap the active layer of the first transistor.

19. The pixel as claimed in claim 14, wherein the second gate is coupled to a capacitor to store a data voltage.

20. The pixel as claimed in claim 14, wherein the first gate extends beyond a terminal of the OLED to establish a coupling to the active layer of the first transistor.

* * * * *